United States Patent
Wagman

(10) Patent No.: US 6,606,402 B2
(45) Date of Patent: Aug. 12, 2003

(54) SYSTEM AND METHOD FOR IN-LINE INSPECTION OF STENCIL APERTURE BLOCKAGE

(75) Inventor: Adam H. Wagman, Framingham, MA (US)

(73) Assignee: Cognex Corporation, Natick, MA (US)

( * ) Notice: Subject to any disclaimer, the term of this patent is extended or adjusted under 35 U.S.C. 154(b) by 0 days.

(21) Appl. No.: 09/939,425

(22) Filed: Aug. 24, 2001

(65) Prior Publication Data

US 2002/0081025 A1 Jun. 27, 2002

Related U.S. Application Data

(63) Continuation of application No. 09/215,899, filed on Dec. 18, 1998, now abandoned.

(51) Int. Cl.[7] .............................. G06K 9/00; G06K 9/68; G01N 21/00
(52) U.S. Cl. ....................... 382/150; 382/170; 382/172; 382/219; 382/220; 356/241.1
(58) Field of Search ................................ 382/141, 144, 382/145, 147, 148, 149, 150, 168, 169, 170, 172, 174, 218, 219, 220; 348/87; 356/237.1, 241.1

(56) References Cited

U.S. PATENT DOCUMENTS

| | | | |
|---|---|---|---|
| 4,490,851 A | 12/1984 | Gerhart et al. | 382/103 |
| 4,760,604 A | 7/1988 | Cooper et al. | 382/155 |
| 4,799,270 A | 1/1989 | Kim et al. | 382/205 |
| 4,876,457 A | 10/1989 | Bose | 250/559.05 |
| 4,958,375 A | 9/1990 | Reilly et al. | 382/159 |
| 5,361,379 A | 11/1994 | White | 382/227 |
| 5,434,927 A | 7/1995 | Brady et al. | 382/104 |
| 5,479,574 A | 12/1995 | Glier et al. | 706/25 |
| 5,768,333 A | 6/1998 | Abdel-Mottaleb | 378/37 |
| 5,859,698 A | 1/1999 | Chau et al. | 356/237.2 |
| 5,912,984 A | 6/1999 | Michael et al. | 382/149 |
| 5,949,901 A | 9/1999 | Nichani | 382/149 |
| 5,982,927 A | 11/1999 | Koljonen | 382/168 |
| 6,061,476 A | 5/2000 | Nichani | 382/270 |
| 6,100,937 A | 8/2000 | DiMeo | 348/621 |

*Primary Examiner*—Mehrdad Dastouri
(74) *Attorney, Agent, or Firm*—William Loginov

(57) ABSTRACT

A system and method for ascertaining blockage of one or more stencil apertures is provided. An analysis of pixels in an image of the stencil region that includes the aperture is made that includes determining the relative grayscale intensity of pixels acquired from the clean stencil and also the variance among nearby pixels. The grayscale and variance values for each pixel are combined to form a series of histogram groupings or bins, based upon levels. These values are used to compute parameters that represent how the apertures appear under the lighting conditions used to acquire the image, thereby allowing the informing of a decision function that estimates the probability that a given pixel represents unblocked aperture rather than solder paste.

15 Claims, 11 Drawing Sheets

SYSTEM AND METHOD FOR IN-LINE INSPECTION OF STENCIL APERTURE BLOCKAGE

RELATED APPLICATION

This is a continuation of U.S. patent application Ser. No. 09/215,899, titled METHOD AND APPARATUS FOR INLINE INSPECTION OF APERTURE BLOCKAGE, by Adam Wagman, filed on Dec. 18, 1998 now abandoned.

FIELD OF INVENTION

This invention relates to machine vision and automated inspection systems, and more particularly to inspection of stencils used in solder paste screen printing of circuit boards.

BACKGROUND OF THE INVENTION

The process of assembling printed circuit boards (PCBs) generally requires solder paste to be applied to the printed circuit board. This application occurs before components, such as integrated circuits and discrete devices, are placed and ultimately secured onto the board. Initially, the sticky solder paste temporarily holds the components in place on the PCB until the solder paste is melted or reflowed. When the solder paste is reflowed, it forms both mechanical and direct electrical connections between the components and the board. It is important that the appropriate quantity and area of solder paste be applied to the board for reliable connections to occur.

In a normal PCB manufacturing process, a stencil is typically placed against the top face of the board in a desired orientation in which the stencil is aligned with preformed metallic contact pads on the PCB. Solder, in paste form, is applied to the stencil so that it flows through precut holes, or apertures, in the stencil onto the contact pads. The solder becomes adhered to the contact pads as the stencil is lifted away. The solder application process often uses a squeegee-like device both to flow solder through the apertures and to remove excess solder from the stencil surface. However, due to the relative thickness of the inner perimeter edges of the apertures, some solder may become trapped against the edges. Hence, the squeegee may not effectively remove all solder from within the used stencil apertures. To maintain the accuracy and reliability of the paste application process, the stencil must remain clean. In other words, the apertures that make up the stencil, and through which the solder paste passes, should remain relatively free of blockage. While blockage of a certain level is generally permissible, aperture blockage beyond a threshold should be addressed as soon as possible by cleaning the stencil. Otherwise, PCBs will not receive the proper configuration of solder paste.

Automatic inspection or vision systems have been used to scan both the finished PCB and the stencil for manufacturing the PCB. One such inspection system is detailed in FIG. 1. The PCB 20 is located on an underlying support 22. Lighting 24 and 26, typically in the form of a series of high intensity LEDs is provided at various locations around the support 22. The stencil 30 is positioned so that it can pass over the PCB. Solder, not shown, is flowed into the apertures 32 and 34 for placement as respective solder pads 36 and 38 on the PCB 20. A vision system 40 is arranged to view the PCB 20 and/or the stencil 30. The vision system 40 can comprise any acceptable image acquisition system. It typically consists of an optics section 42 for focusing viewed images and one or more cameras 44 typically including a solid-state CCD element. The electronic image generated by the CCD is transmitted over a data line 46 to a data processor 48 that can comprise microprocessor elements and digital signal processing components. A memory 50 is used to store image data as well as processing instructions. Various input/output (I/O) devices 52 including display screens, keyboards, and the like are interconnected with the vision system processor. These provide the operator with information about the ongoing inspection process and enable the operator to input instructions and inspection parameters.

The ongoing inspection of stencils and PCBs during "runtime" involves complex procedures. In the past, various techniques have been employed to measure stencil blockage. One category of techniques examine only the image of the stencil after printing (the "post" image), and they typically attempt to establish a binary graylevel/grayscale threshold to classify pixels as either aperture or non-aperture, i.e. all pixels darker than a certain grayscale value are considered aperture. Such "post-only" techniques suffer from a number of deficiencies. They typically need to make fairly simple assumptions about the appearance of paste, and they are very susceptible to incorrectly interpreting changes in lighting as changes in blockage, since pixels having measured intensities near the threshold will migrate above or below the threshold as lighting changes. Similarly, different types of paste may have different appearances, creating further difficulty for a post-only technique.

Accordingly, it is an object of this invention to use an image of the clean stencil (the "pre" image) as well as the post image in order to make measurements that are both more accurate and more robust, by using the pre image to model what clean apertures look like under lighting similar to (ideally, identical to) the lighting used to acquire the post image. An additional object is to use local variation of pixel values to help discriminate between aperture pixels and paste pixels, since under many types of lighting solder paste appears highly textured, unlike aperture, which is always relatively locally uniform. Thus, the current invention should discriminate between paste and aperture even if some dark paste pixels have the same value as some bright aperture pixels—as a grayscale-only technique cannot make such a discrimination.

SUMMARY OF THE INVENTION

This invention overcomes the disadvantages of the prior art by providing a system and method for ascertaining blockage of stencil apertures (typically on PCB manufacturing stencils) that more accurately and robustly delineates actual solder blockage from the unblocked portion of the stencil aperture using the viewed grayscale intensity of aperture pixels before and after use, and also the variance or difference in grayscale intensity between directly adjacent or nearby, nonadjacent pixels. Use of such a "pre-post" technique allows measurements to be made even if the lighting changes somewhat, and the technique's emphasis on modelling the clean aperture enables it to deal with a variety of different types of solder paste.

According to a preferred embodiment, an analysis of pixels in an image of one or more apertures is made that includes determining the relative grayscale intensity of pixels acquired from the clean stencil and also the variance between directly adjacent and/or nearby (not directly adjacent) pixels. The grayscale and variance values for each pixel are combined to form a series of histogram groupings or bins, based upon grayscale levels. These values are used to compute parameters that model how the apertures appear under the lighting conditions used to acquire the image, thus allowing the creation of a decision function that estimates the probability that a given pixel represents unblocked aperture rather than solder paste.

Image data for each aperture are used to calibrate the lighting level of each window's pixel data on the clean stencil. The area of each clean stencil aperture is also determined using the weighted pixel measurements. Pixels having high variance or non-aperture grayscale intensities are, in essence, discarded from the area determination. During runtime, the aperture is measured and the intensity and variance are ascertained for each pixel. The measured area is again ascertained, and the difference between clean and used aperture area is calculated and reported. If the difference is significant, then the operator is notified that stencil cleaning is required.

In a preferred embodiment, the stencil is registered to model data to locate a group of apertures. The image is then divided into separate windows, each containing an aperture that can be analyzed separately after lighting calibration; the use of separate windows allows small lighting variations among apertures to be factored out. Lighting recalibration can be performed on an on-going basis to adjust for overall changes in lighting.

BRIEF DESCRIPTION OF THE DRAWINGS

The foregoing and other objects and advantages of the invention will become more clear with reference to the following detailed description as illustrated by the drawings in which.

DETAILED DESCRIPTION OF AN ILLUSTRATIVE EMBODIMENT

Figure 1:
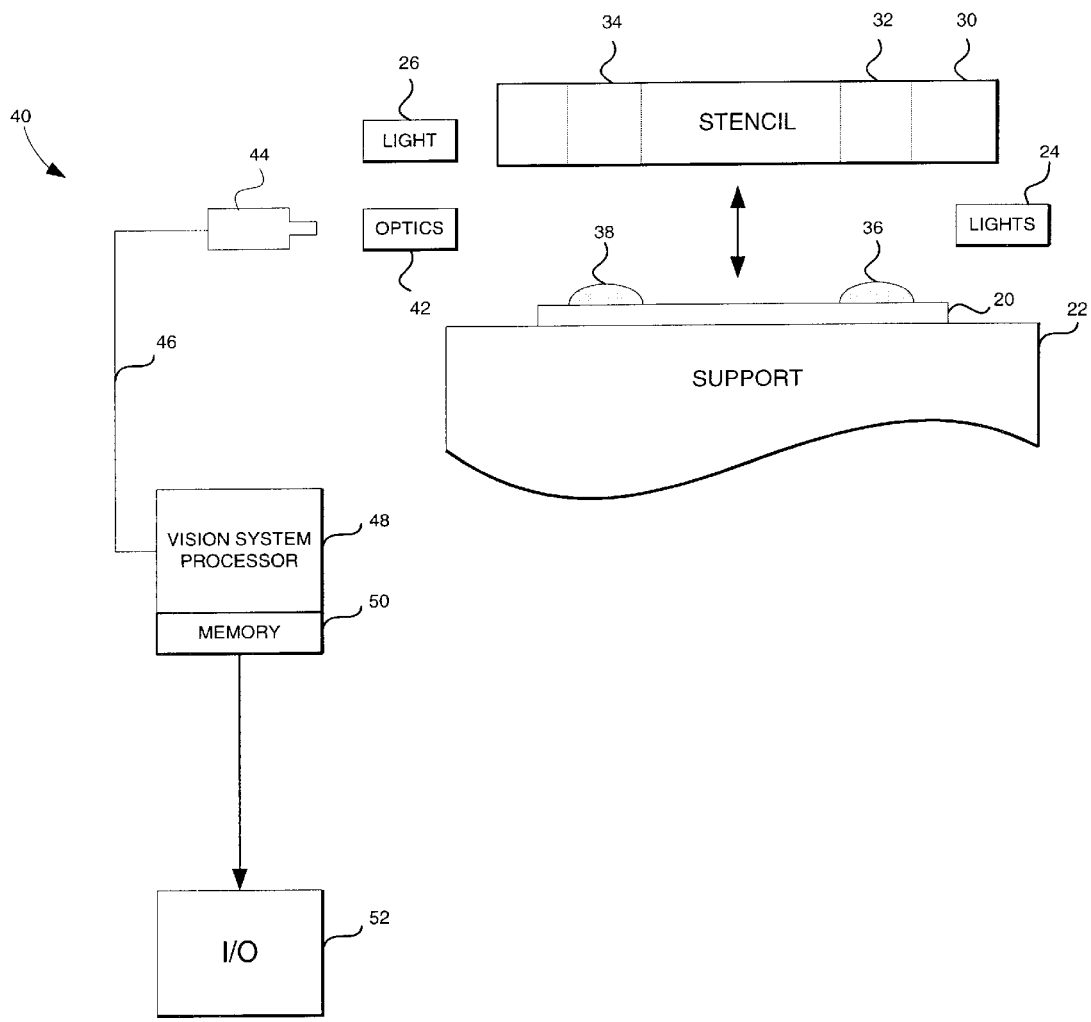
FIG. 1, already described, is a schematic diagram of a printed circuit board manufacturing facility including a stencil and an inspection system according to the prior art.
Figure 2:
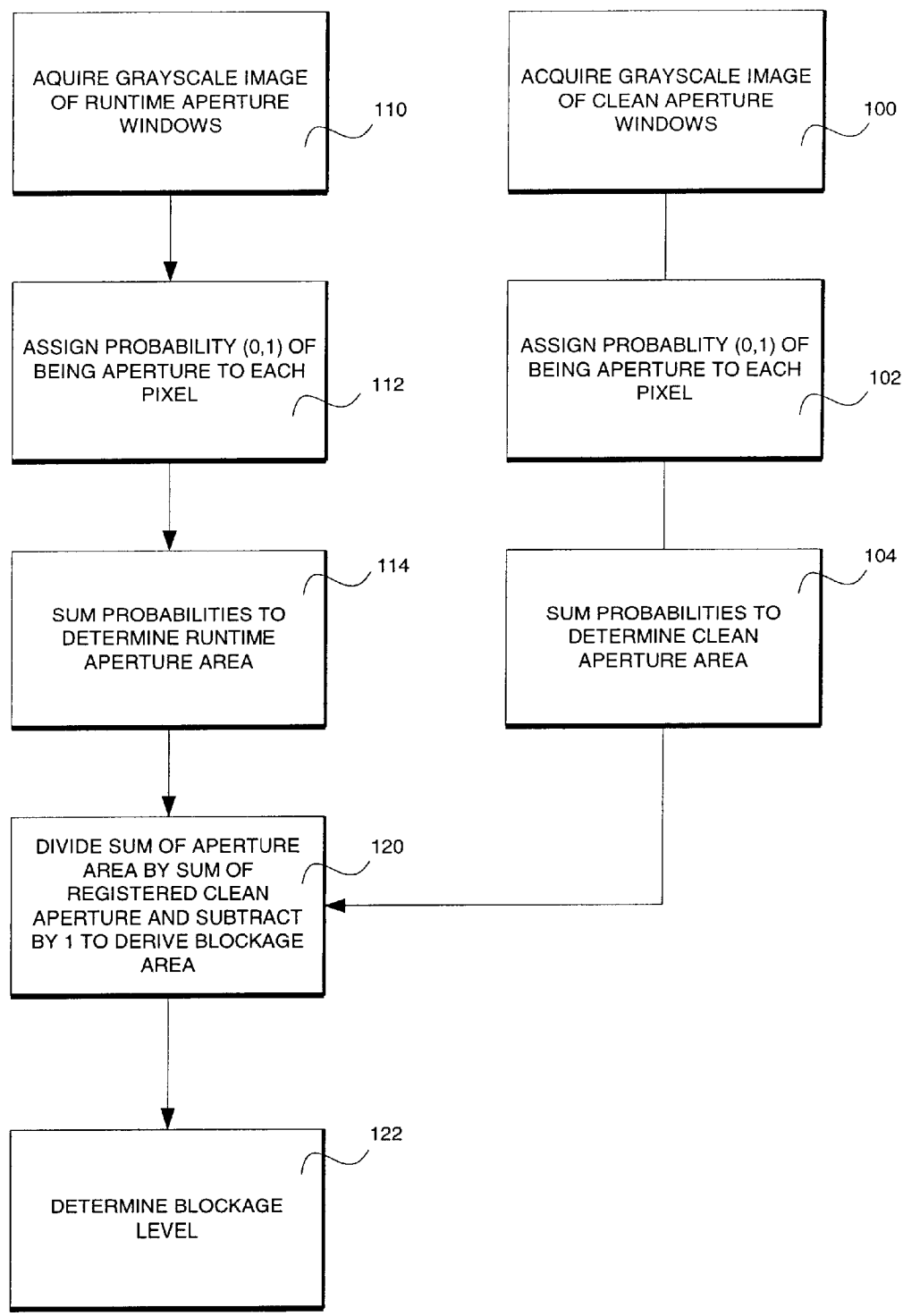
FIG. 2 is a diagram of a generalized stencil inspection procedure according to this invention.

An overview of a process for inspecting stencils according to this invention is detailed in FIG. 2. The underlying physical inspection system can be configured like that shown in FIG. 1, with the processor executing the procedures described hereinbelow. Such procedures can be implemented using hardware, software, or both in combination. As described generally above, it has been recognized that blockage of stencil apertures by solder paste is difficult to determine, in large part, because of the variable appearance of solder paste, which is further complicated if lighting is not highly consistent from acquire to acquire. Machine vision systems typically acquire grayscale images (e.g., the intensity of reflected light within a predetermined range of incremental values) for analysis. The image is divided into individual pixels, each assigned a particular grayscale level. In one preferred embodiment, the machine vision system uses an eight-bit (i.e., 256-value) grayscale range to quantify pixel intensity. In general, a pure white value will stand at one end of the range while a pure dark value will stand at the other end of the range. In this embodiment the darkest pixels are given a digital value of zero (0) in the grayscale. Conversely, the lightest values are given the value of 255. Ideally, the viewing area should be illuminated in such a way that all paste pixels occupied one range of pixel values, while all aperture pixels would occupy another, nonoverlapping, range of pixel values. In practice this is not usually achieved, both because of the variable nature of paste and because of restrictions on the lighting imposed by the typical design of the printing machine.

By way of introduction, early "post-only" inspection techniques typically attempt to analyze an intensity histogram of the post image to determine a binary threshold level. Pixels darker than the threshold are considered aperture, while those that are brighter are considered paste. Difficulties are often experienced with such a technique. First, there is often no clear intensity level at which to choose such a threshold because the darker regions of paste overlap the brighter regions of aperture in a histogram (refer for example to the used-stencil histogram of FIG. 4). Second, different types of paste have different appearances, making it more difficult to refine the technique for choosing a threshold. Third, variations in lighting can change the appearance of the histogram. Fourth, a single binary threshold produces instability in classifying pixels near the boundaries between aperture, paste, and stencil. For typical apertures, this single established threshold can produce a significant loss of repeatability (i.e., blockage values reported for successive acquires of the same stencil may vary by an unacceptable amount). Finally, under some types of lighting, significant amounts of paste may be as dark as the brighter regions of aperture, making it fundamentally impossible to distinguish between the two using only the raw grayscale information. These various difficulties place limitations on the accuracy of post-only thresholding techniques, and also limit their robustness in dealing with different types of paste and with changes in lighting.

The present invention uses a number of techniques to overcome these difficulties. First, it uses information in a clean "pre image" (prior to application of solder material thereonto) to model the appearance of unblocked aperture, so that pixels that deviate from the expected values in the post image will then be considered paste. Because the appearance of aperture is highly consistent, modelling it (instead of paste) allows discrimination against almost any type of paste. Use of the pre image also allows for adjustments under the current lighting, used for both the pre and post images, or even to adjust for small lighting changes between the pre and post images. Second, a soft thresholding technique is used to more accurately classify boundary pixels, which increases repeatability. Third, explicit effort is made to reduce the effect of small variations in lighting, so that, for example, an increase in lighting (which makes pixels brighter on average) is not interpreted as an increase in blockage. Finally, local variation of pixel values is used in addition to the raw pixel values themselves in order to classify pixels as aperture or as paste. Local variation is essentially a measure of how "textured" the image appears, and under many types of lighting, paste appears highly textured, while aperture (which is just a hole with nothing in focus behind it) appears quite smooth.

In order to analyze stencil blockage in view of such unpredictable conditions, FIG. 2 details the following generalized procedure in which image data is used to determine aperture blockage. First, a grayscale image of a set of apertures is acquired and stored in memory. This occurs in step 100. The image is then processed to produce both grayscale and variance histograms of the apertures, after eliminating from consideration pixels that are stencil. Stencil pixels are usually quite distinct in grayscale level, so that distinguishing them from aperture can be done simply by a number of techniques, including establishment of basic thresholds. The two aperture histograms (grayscale and variance) and an additional histogram of a combined grayscale/variance image (a co-occurrence image) are analyzed in terms of a predefined model to compute parameters that characterize aperture pixels, enabling a probability (in the range 0.0 to 1.0, inclusive) to be assigned to each histogram bin that a pixel falling in that bin represents aperture. Assigning of probabilities occurs in step 102. The actual assignment of such probabilities is described in further detail below. In general, it requires the use of histogram analysis according to this invention.

Next, step 104 specifies the summing of all probabilities within a given window to determine the overall clean aperture area. Note that probabilities are assigned such that boundary pixels tend to have a probability of approximately 0.5. This "soft thresholding" (i.e., assigning intermediate values to boundary intensity levels instead of forcing them into either a "zero" or "one" weighting) greatly increases repeatability of the measurement. This entire procedure of analyzing the pre image of a clean stencil to compute model data is referred to as lighting calibration, since its purpose is to more accurately model the appearance of aperture under the given lighting conditions. A practitioner skilled in the art will appreciate that it is possible to replace this lighting calibration step by storing precomputed values or by using approximations. Such techniques are useful if the lighting conditions are well controlled, so that one does not need to take the time to acquire an image and recompute the model. In typical usage, an image of the clean stencil needs to be reacquired at the time in which the lighting is changed, or possibly after each time the stencil is cleaned. Thus, there is little impact on throughput operating speed of the PCB printing/manufacturing machine.

In a largely related step, the runtime grayscale image of a used stencil aperture is acquired in step 110, ideally under lighting conditions as close as possible to those used for the lighting calibration step (although, as described below, adjustments are made for possible lighting changes). Registration is performed to align a model of the stencil to the runtime image. This registration can be a rough approximation, and can be omitted entirely if the mechanical alignment of the system is sufficient. The particular registration algorithm used is not critical, and registration can be offset by several pixels without affecting the results.

The preferred embodiment uses two one-dimensional normalized correlation searches (horizontal and vertical) between projections of the image and projections of a binary model of the apertures. An alternative method of registration uses fiducials as described in U.S. Pat. No. 5,500,906, which is incorporated herein by reference. A probability of each pixel in the window being aperture is assigned in step 112, using the data gathered in the lighting calibration stage described above. The probabilities are summed in step 114 to determine the overall unblocked area of the aperture. Typically, steps 100, 102 and 104 occur at the beginning of the overall manufacturing process for a given stencil. Steps 110, 112 and 114 occur continuously throughout runtime at desired inspection intervals. Such intervals can, in fact, be after each use of the stencil or after a certain number of uses of the stencil. In step 210 the unblocked aperture area of step 114 is divided by the clean aperture area (originally derived in step 104). This unblocked area value is substracted from one (1) to derive to block area fraction. Clearly, if the area of the used and clean aperture are the same, the blocked area will be zero. The degree of blockage is determined in step 122 and is announced to the system. Such announcements can include alarms, automatic shutdown procedures or general indicators of status to an operator. For example, if blockage beyond the predetermined acceptable level is observed, the system can be instructed to flash a message on the operator's display screen announcing that cleaning of a stencil is required, or it can automatically preform such cleaning.

Figure 3:
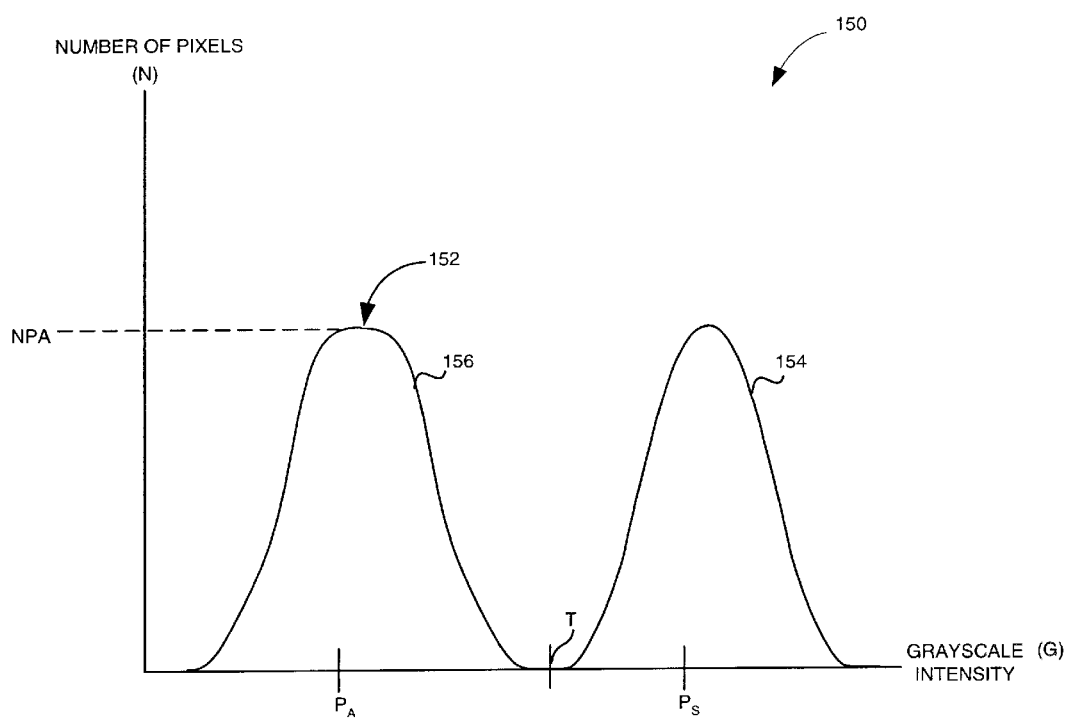
FIG. 3 is an exemplary grayscale histogram of a clean stencil.

Each of the steps performed in the preferred embodiment during lighting calibration and runtime will now be described in detail. During lighting calibration, a grayscale histogram of the registered stencil window is computed. To allow for small lighting variations among the different apertures, this is actually a "desmeared" cumulative histogram (described in further detail below). A grayscale histogram is simply a count of the number of pixels N at each possible grayscale intensity value G. A typical histogram 150 of a clean stencil appears as in FIG. 3, with a single dark peak 152 (on the left side of the curve) with a grayscale intensity value PA representing the aperture and a single bright peak 154 (right side of the curve) with a grayscale intensity value PS representing the stencil. The first step is to find a threshold T to distinguish between the twin peaks 152 and 154, since only the aperture pixels are needed for the determination of aperture area. Since the peaks are well separated, a number of techniques are possible for finding such a threshold. The preferred embodiment uses the commercially available Edge-Enhanced Thresholding Tool from Cognex Corp. of Natick, Mass. Minimization of variance for two populations can also be used to locate threshold.

Once the aperture peak 152 has been separated out, it is analyzed to compute model data that will be used at runtime to determine which pixels represent aperture. Clearly, there are many possible ways to model such an aperture peak. The precise model can be varied. The preferred embodiment entails smoothing of the histogram 150, then computing the peak location and the peak width (along scale G) at several points (specified as the points where the histogram curve 156 drops to a certain fraction of the peak value NPA). Some care is taken to model the right (brighter) side of the aperture peak carefully, as that is the region that might be partially overlapped by dark paste on the stencil at runtime. Accurate modelling of this potential overlap region allows for better discrimination against paste.

In practice, inside a PCB printing machine there may be slight variations in the lighting level (i.e., the location of the grayscale histogram peak) that appears through each aperture. For example, the metallic print head may be near some of the apertures, causing slightly more light to be reflected back though those apertures than through the others. Ambient lighting can also play a role if the machine is not completely covered. The technique of this invention is sensitive enough that such slight differences in brightness can be interpreted as blockage (because brighter pixels have a higher chance of being paste). To compensate for this, instead of simply computing the histogram of all the apertures as a group, a "desmeared" histogram is computed by taking the histogram of each aperture, determining where the peak in the individual histogram is, and then shifting all the histograms to line up before summing them to produce the final histogram. This refinement is useful under some circumstances, but usually can be omitted without substantial adverse effect.

Figure 4:
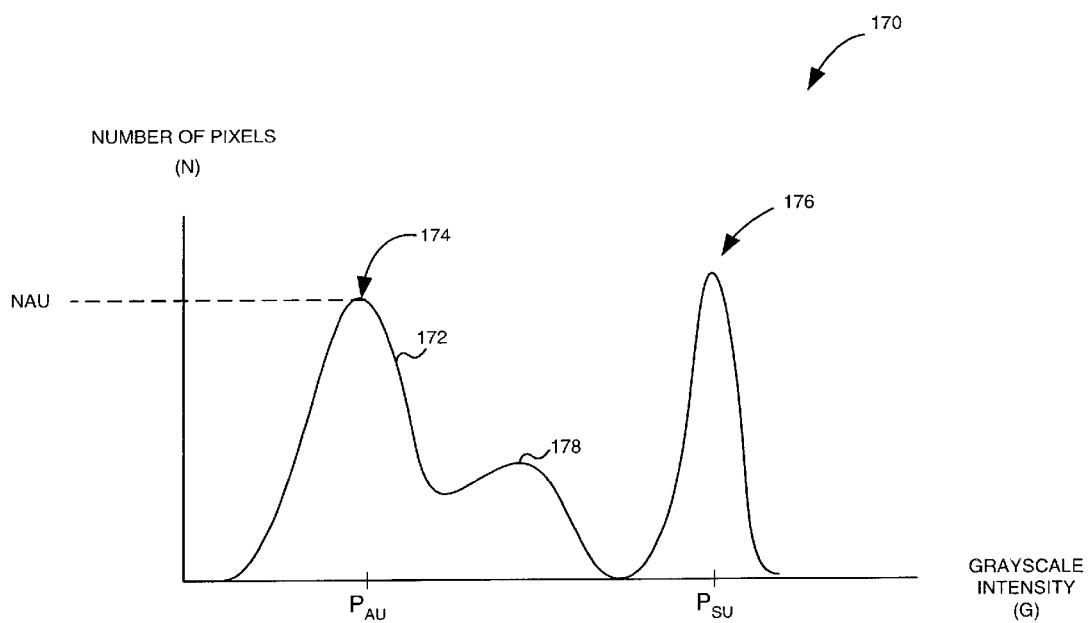
FIG. 4 is an exemplary grayscale histogram of a used stencil.

Under some lighting conditions and for some types of solder paste, using only the aforementioned grayscale analysis provides sufficient information to achieve desirable results. If the paste can be made to appear so that its gray levels do not overlap too substantially with the aperture, then exclusive use of the grayscale information will suffice. However, use of local variation, or texture, information can be vital for added ability to discriminate against paste for other types of paste or lighting. It is sometimes possible for a dark paste peak to substantially overlap the brighter part of the aperture, so that it is impossible to determine from grayscale value alone whether a pixel is aperture or paste. However, paste can often appear textured, whereas aperture always appears relatively smooth. Measuring this texture provides additional information that can be used to correctly classify a pixel as aperture or as paste. There are many possible ways to measure texture. FIG. 4 details the exemplary histogram 170 of a used stencil with apparent blockage. The curve 172 includes a main dark (aperture) peak 174 at grayscale level PAU that is lower in maximum pixel count (NAU) than the clean stencil of FIG. 3. The light (stencil) peak 176 is similarly located at level PSU. A secondary, lower peak 178, that slightly overlaps the right (lighter) side aperture peak 174 appears. This peak 178 represents the effects of paste across a relatively broad intermediate range of the grayscale G.

The preferred embodiment computes the difference in grayscale value between the minimum and maximum pixels in a two-by-two-pixel region to produce a "variance image" that contains the variance value for each pixel in the original grayscale image. Those skilled in the art will appreciate that use of a two-by-two kernel introduces a half-pixel shift in each dimension relative to the original image (basically, the value computed represents the value at the center of the two-by-two grid rather than at the center of the upper-left pixel). The preferred embodiment uses digital resampling to eliminate this shift. The reason for the use of such a small kernel, and for compensating for the halfpixel shift, is that the boundary of an aperture can represent a significant fraction of its total area (e.g. 10–20%), and use of a small kernel retains sensitivity near edges. Failure to make accurate classifications near boundaries can result in substantial sensing repeatability problems. However, other kernel sizes and other metrics of variance may be used without departing from the spirit of the invention.

There are a number of ways to combine the grayscale and variance information to classify pixels. The preferred embodiment combines the original grayscale image with the variance image, using information obtained during the histogram analysis, to form a single co-occurrence or "class" image, where each pixel value represents both the original grayscale and original variance values. For efficiency, the co-occurrence image is kept to eight bits in depth, the same as the grayscale and variance images. This compression from sixteen bits of raw information to eight bits is accomplished by segmenting the grayscale and variance histograms into a smaller number of bins. The bins are selected so that little information is lost. For example, if a grayscale pixel is darker than the aperture peak, it is essentially certain to be an aperture pixel rather than a paste pixel. Thus, all the histogram bins below the peak are essentially equivalent and may be considered a single group. Similarly, all gray levels brighter than the right edge of the peak are boundary pixels. It is the right half of the peak that is kept as several bins to allow finer discrimination. Similarly, the variance histogram is split into bins where all values below the peak are considered a single category, and higher values are maintained in separate bins. Use of a single eight-bit "class image" formed in the above way is a conceptually straightforward way to combine the information and is particularly efficient for processors with optimized eight-bit implementations of histogramming, pixel mapping, and addition. On other processors or machine architectures it may prove more efficient to operate directly on the original grayscale and variance images for the classification operation.

Figure 5:
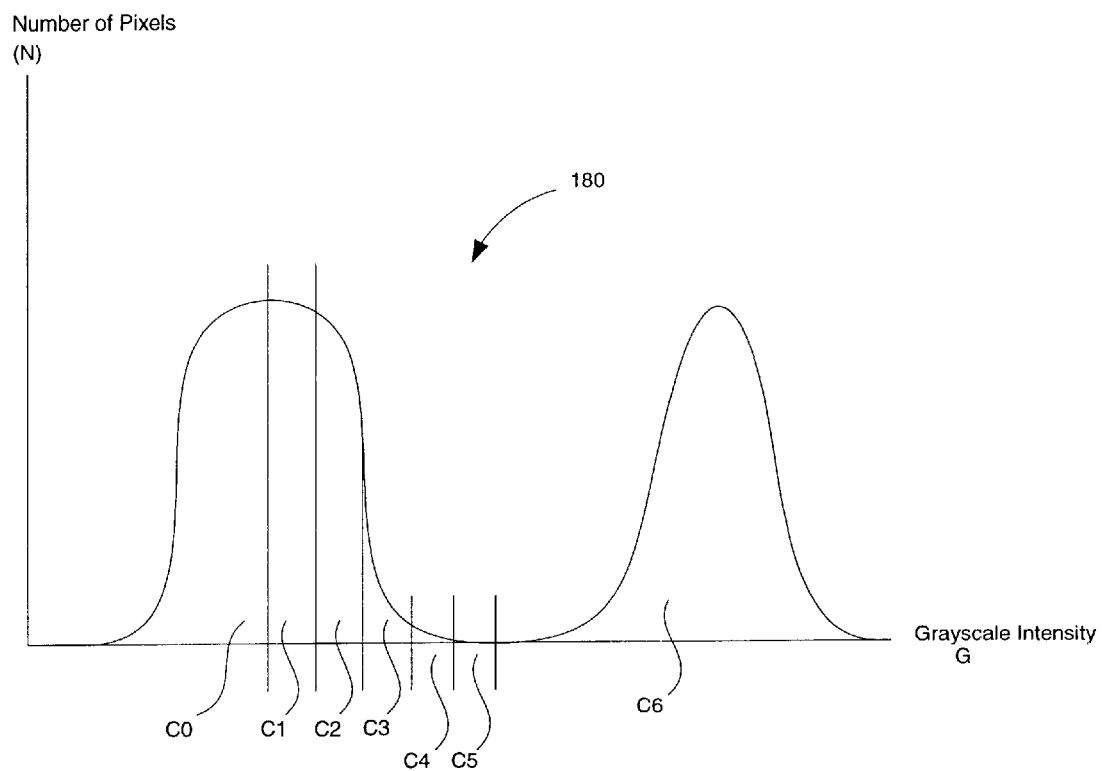
FIG. 5 is an exemplary grayscale histogram of a clean stencil showing segmentation thereof into categories according to this invention.

FIG. 5 shows an example of segmenting the grayscale histogram 180 of a clean stencil into a small number of categories, where all the gray values G in a given category are considered to be similar, i.e. to have approximately the same probability of representing aperture. The exact number of categories is not important. The figure define seven as an example. Note that all very dark pixels, which are essentially certain to be aperture, are in one category (C0), and all very bright pixels, which are essentially certain to be non-aperture (either stencil or, at runtime, possibly paste), are in another category (C6). A larger number of separate categories are used for the pixels in ranges where overlap with paste is more likely. Note that pixels in categories C4 and C5 are likely to be boundary pixels.

Once the grayscale and variance histograms have been segmented into categories, the original grayscale and variance images are mapped by their categories and added together to form the co-occurrence or "class" image. For example, suppose that each histogram was segmented into ten categories. The grayscale categories could be labeled 0, 10, . . . 90, and the variance categories could be labeled 0, 1, . . . 9. Then a pixel whose grayscale value fell into grayscale category 10 and whose variance value fell into variance category 5 could be represented by the unique value 10+5=15. This resultant value (15) is termed the pixel's class. The idea is that all pixels in a given class should have approximately the same probability of representing aperture. Note that the grayscale and variance categories are labeled so that the sum of any two is unique, so that the final single class value uniquely represents both the original grayscale category and the original variance category.

Based upon this classing procedure, a class histogram for the particular stencil aperture is finally derived. This histogram of the class image includes bins that, in essence, each contain all the pixels of a particular pair of grayscale and variance (g, v) bin values. As will be described further below, a decision function d(g, v) is then used to decide the weight (between zero and one, inclusive) to be assigned to each histogram bin within the class histogram. The unblocked aperture area is then computed as the sum over all the bins of the weight of the bin multiplied by the population of that bin. As noted above, weights close to one represent pixels that are very likely to be aperture, weights close to zero represent pixels that are unlikely to be aperture, and intermediate weights may be used to represent aperture boundaries or for other reasons described below. Based upon the weighting system, which favors the area most likely to be aperture, as opposed to stencil or perimeter, a more-reliable measure of aperture is obtained for both the unused (clean) stencil, and for the used, runtime stencil. This weighted result is used by the inspection system as the value of area for each aperture/window in the overall stencil.

It is possible to choose a decision function in many ways within the spirit of the invention. The basic method is to assign a high weight (near one) to pixels that are similar to the aperture pixels in the pre image and to assign a low weight (near zero) to pixels that are not similar to aperture pixels. Also, weights near 0.5 are used to represent boundary pixels. Use of such soft thresholding reduces repeatability problems associated with spatial quantization. The preferred embodiment employs the following choices.

First, all classes deriving from grayscale classes representing pixels near or below the original grayscale peak are given weight one, regardless of their variance value. This is because, under typical good lighting, paste is at least slightly brighter than aperture, so that the darkest pixels cannot be paste. Second, all classes whose grayscale category lies within the right half of the original grayscale peak and whose variance category lies within the original variance peak (i.e., low variance values) are also given weight one. This represents the fact any pixel within the aperture grayscale peak is very likely to be aperture so long as it is also smooth. These two sets of classes together constitute the "base area" of the aperture, i.e. the pixels that are most certain to represent unblocked aperture. Third, all classes whose grayscale category corresponds to pixels brighter than the boundary of the aperture or whose variance is extremely high are given weight zero. Such pixels are too bright or textured to represent aperture. Fourth, classes whose grayscale category lies in a region indicative of boundary pixels (off the right tail of the aperture peak) are assigned a weight of 0.5. Finally, all other classes (i.e., those whose grayscale categories are on the right part of the aperture peak and which have intermediate variance values) are given a weight of one during lighting calibration, but the weight of these "tail classes" at runtime may be "clamped" to a value less than one, as described further below. Note that the separation of the original full ranges of the grayscale and variance histograms into a smaller number of categories is typically done with the creation of a decision function in mind. For example, all pixels with grayscale value less than that of the aperture peak were all assigned to a single grayscale category precisely because we wish to treat all such pixels in the same way in the decision function.

Conceptually, the base area is the area that is almost certain to be entirely aperture, and typically consists of all the central pixels of the aperture out to a region within one to three pixels of an aperture boundary. There will be a "right tail" of pixels in the grayscale histogram (i.e., the far right side of the aperture peak in the histogram curve) that are less certain to be aperture, but usually are (except in the presence of unusually dark paste). Thus, such right tail pixels are counted at weight 1, but are limited (i.e. "clamped") as to how much they can add to the base area, because they represent aperture only if they are the tail of an aperture peak, not if they are a peak of their own (i.e., dark paste—like peak 178 in FIG. 4).

By way of example, assume that during the lighting calibration step, the base area is determined to be 1000 pixels, and that pixels on the right tail add an additional 100 pixels, or 10% of the base area. Then, if during runtime, the base area is found to be 800 pixels (reduced from 1000 because of blockage), and there are an additional 200 pixels that belong to the tail classes, then the 200 would be clamped to 80 (10% of 800). Accordingly, the total unblocked area would be considered 880 pixels, not 1000. This clamping of weights is only one of many possible ways to discriminate between aperture and paste. Note that clamping is an added precaution against the possibility of paste that is both relatively dark and low variance. Other techniques can be used, especially if, for a particular process, more information about how paste will appear is available. Then a model of the paste may be used in addition to a model of the aperture. Also, note that the decision function above and the use of clamping express a preference that, if the classification of a pixel is uncertain, it is better to specify that it represents blockage; in other words, it is usually better to clean a stencil slightly more often than is strictly necessary than it is to allow a blocked stencil to continue to be used, since detecting and correcting misprinted PCBs is expensive. Clearly, the decision function could be adjusted somewhat to express other preferences.

Intermediate pixel classes correspond generally to the aperture perimeter. Thus, the clamping fractions computed above should really be computed as fractions of the area of the perimeter and not of the entire area. Accordingly, a correction factor is derived. This correction factor equals the square root of the calibrated base area divided by the measured base area. In general, the specifying of limits as a fraction of the base area prevents pixels that appear in the extremes from being counted as aperture unless that aperture is actually in the extreme.

Note that the use of a decision function $d(g,v)$ operating on multiple dimensions of information for a given pixel can be easily extended if more information is available or useful. For example, if a color (as opposed to grayscale) camera is used, then color information may also be used to discriminate between aperture and paste, or between paste and stencil.

Having described the general derivation of aperture area based upon histogram analysis, a more-detailed description of stencil blockage determination is provided hereinbelow.

Figure 6:
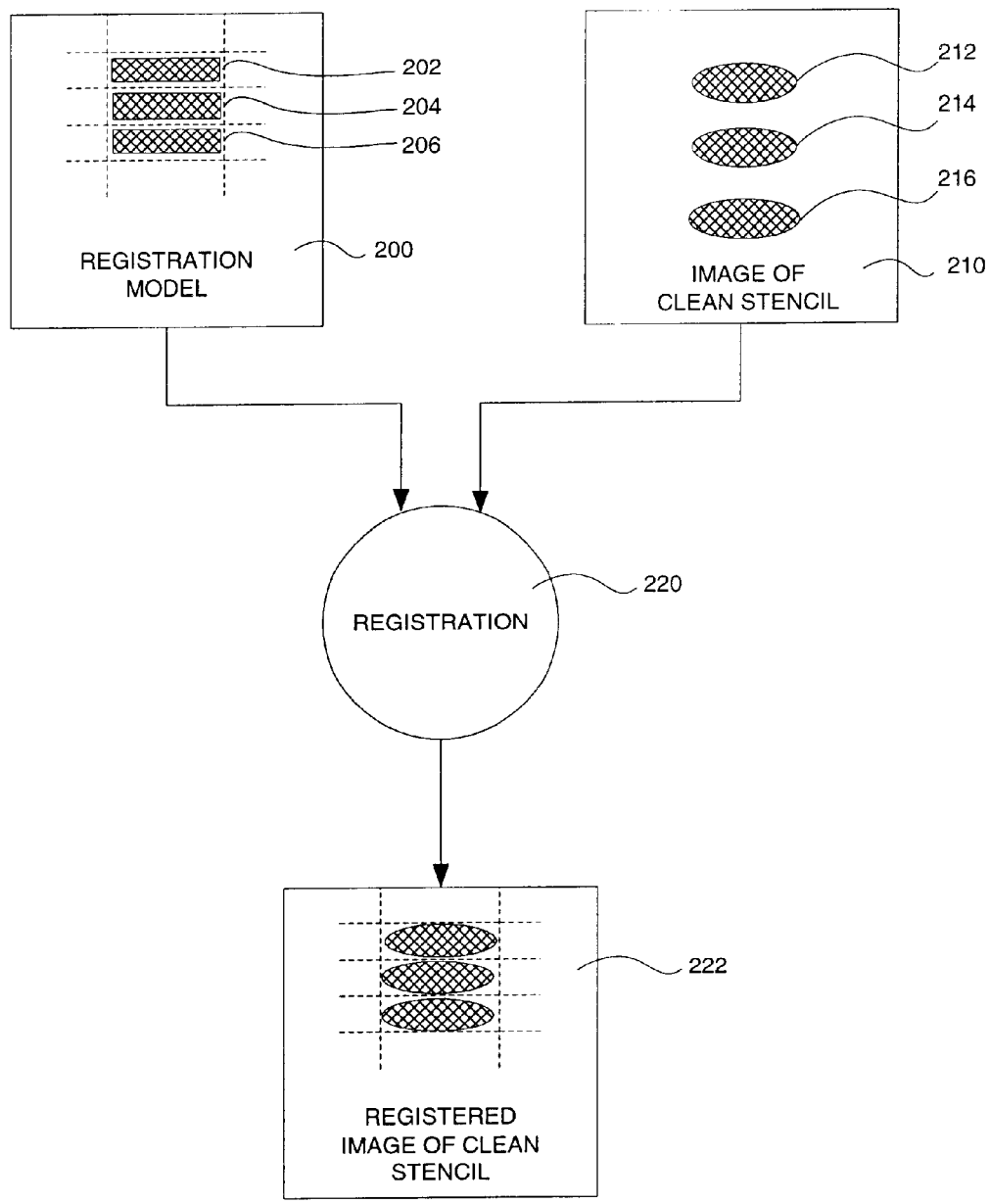
FIG. 6 is a flow diagram of an initial registration step for model and clean stencil image data according to this invention.

FIG. 6 details the initial registration, described above, which in general is desirable in determining clean stencil area and other calibration parameters to be described further. Where only one aperture is used, or where mechanical control over the positioning system is sufficient, registration is not always needed. However, registration allows the system to focus its scan on the areas of the stencil most likely to contain the structure of interest (aperture) and to disregard surrounding image data. This improves accuracy and speeds the process. Given a series of apertures, each divided into individual "windows," registration is particularly desirable. In general, according to FIG. 6, a registration model 200 is provided in the memory of the processor. Each aperture 202, 204 and 206 in the registration model is located at a particular known position within a grid that simulates the actual stencil having specific dimensions. The processor is programmed to use these aperture positions, shapes and sizes in analyzing the apertures of the clean stencil and the runtime stencil. The clean stencil 210 includes actual physical apertures 212, 214 and 216 that are assumed to be positioned in approximately the same relative location as the windows of the model data grid. The camera scans the clean stencil 210 and, via a registration process as described above, determines the corresponding location of the registration model in the acquired image. This provides a stored registered image of the clean stencil 222. During the initial scan of the clean stencil, initial lighting calibration is also performed, including all the steps discussed previously (creation and analysis of the class histogram). This is desirable as it standardizes the grayscale levels of the clean stencil image for later comparison with the runtime image.

Figure 7:
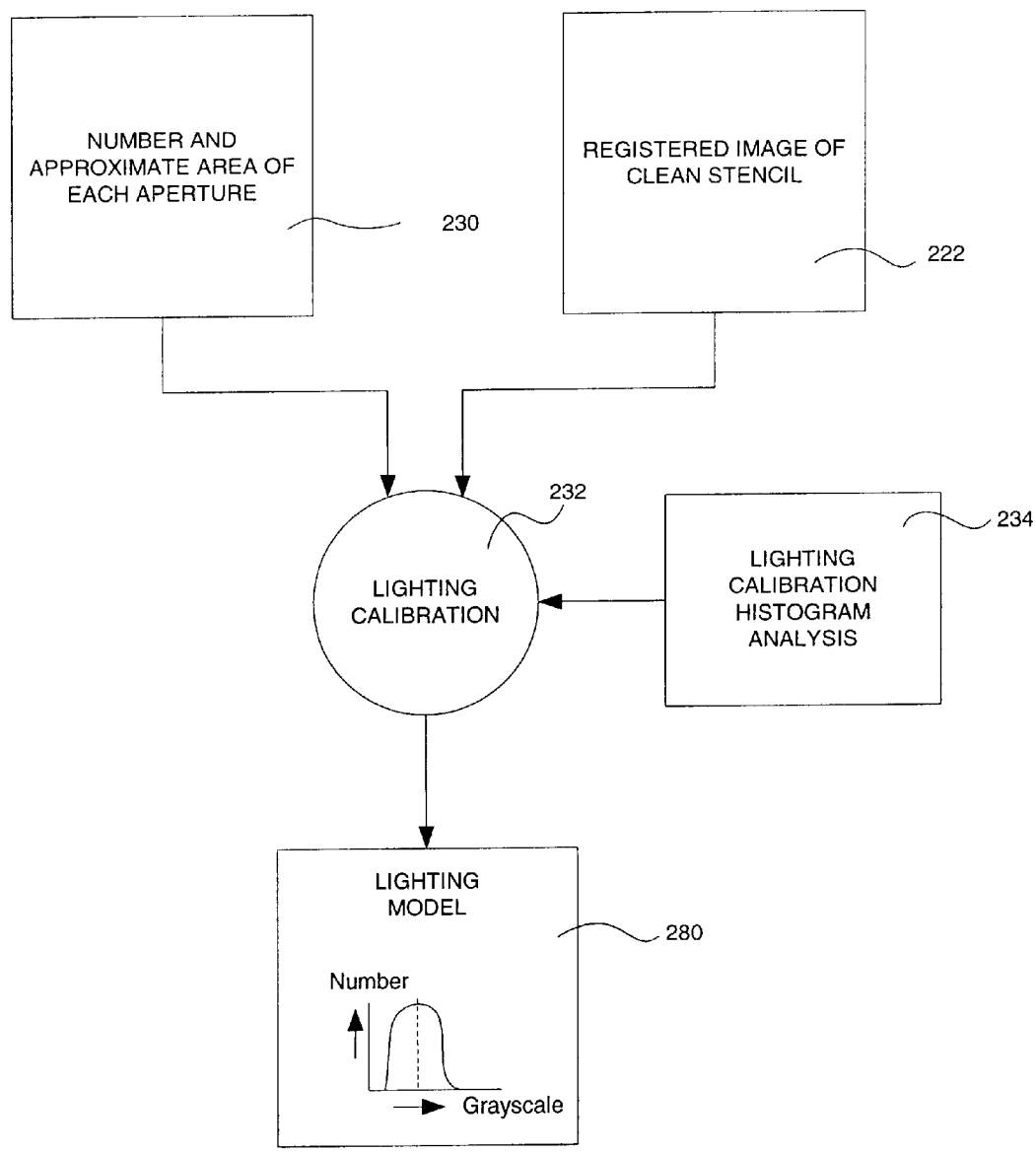
FIG. 7 is a flow diagram of an initial lighting calibration step according to this invention.
Figure 8:
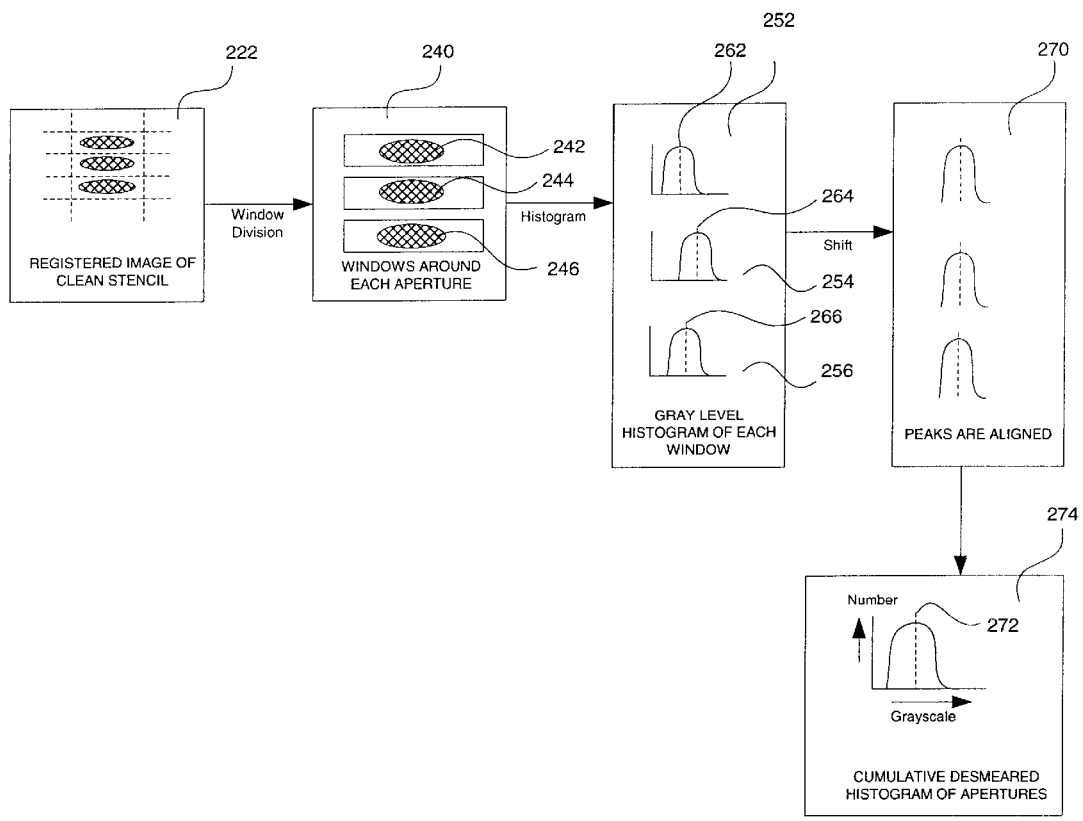
FIG. 8 is a more-detailed flow diagram of a histogram analysis in connection with the lighting calibration step according to this invention.

With reference to FIG. 7, the number and approximate area of each aperture 230 is determined from the model. The registered image of the clean stencil 222 is combined and the lighting calibration is set during the lighting calibration step 232. Lighting calibration requires a histogram analysis 234 that is further detailed in FIG. 8 and was described previously. In general, the registered image of the clean stencil 222 is divided into individual windows in step 240. Each window is then analyzed and a gray level histogram as described above, is obtained. In other words, windows 242, 244 and 246 of the example result in gray level histograms 252, 254 and 256 respectively. The bins with the highest number of pixels versus intensity, denoted as peaks 262, 264 and 266 respectively, are identified. The peaks of each histogram may vary along the grayscale due to lighting irregularities, and the like. Since the gray level of each aperture, forming the peak, should be constant, all pixels within each window are shifted for gray level so that the peaks are realigned in step 270. The histograms of all windows are then again summed to create an ultimate peak 272 within an accumulated, desmeared histogram of apertures 274. This results in the overall lighting model 280 (FIG. 7) with appropriate shifts of pixel values for each window, resulting in a constant grayscale level for all windows. Note, that lighting calibration occurs with the clean stencil just before the first application of solder. In other words, it occurs within the lighting conditions that are expected to exist in the processed area where the stencil is being used. In this manner the overall lighting calibration data is used during runtime to analyze the used stencil windows. It is, in essence, a rough calibration that accounts for lighting variations. As will be described further below, lighting can vary significantly on an ongoing basis. Further calibration, referred to as recalibration, may occur during runtime.

It should be noted that the computation of a desmeared histogram instead of a simple cumulative histogram is not strictly necessary, but may provide increased accuracy when lighting is not quite uniform. Also, by computing and returning the variation in peak locations in the individual aperture histograms to the operator, the operator can be notified if the variation is unusually large, which is an indication of poor lighting; the operator can then adjust the lighting to improve the metric.

Having described the calibration and construction of image classes, runtime analysis of the stencil occurs as follows.

Figure 9:
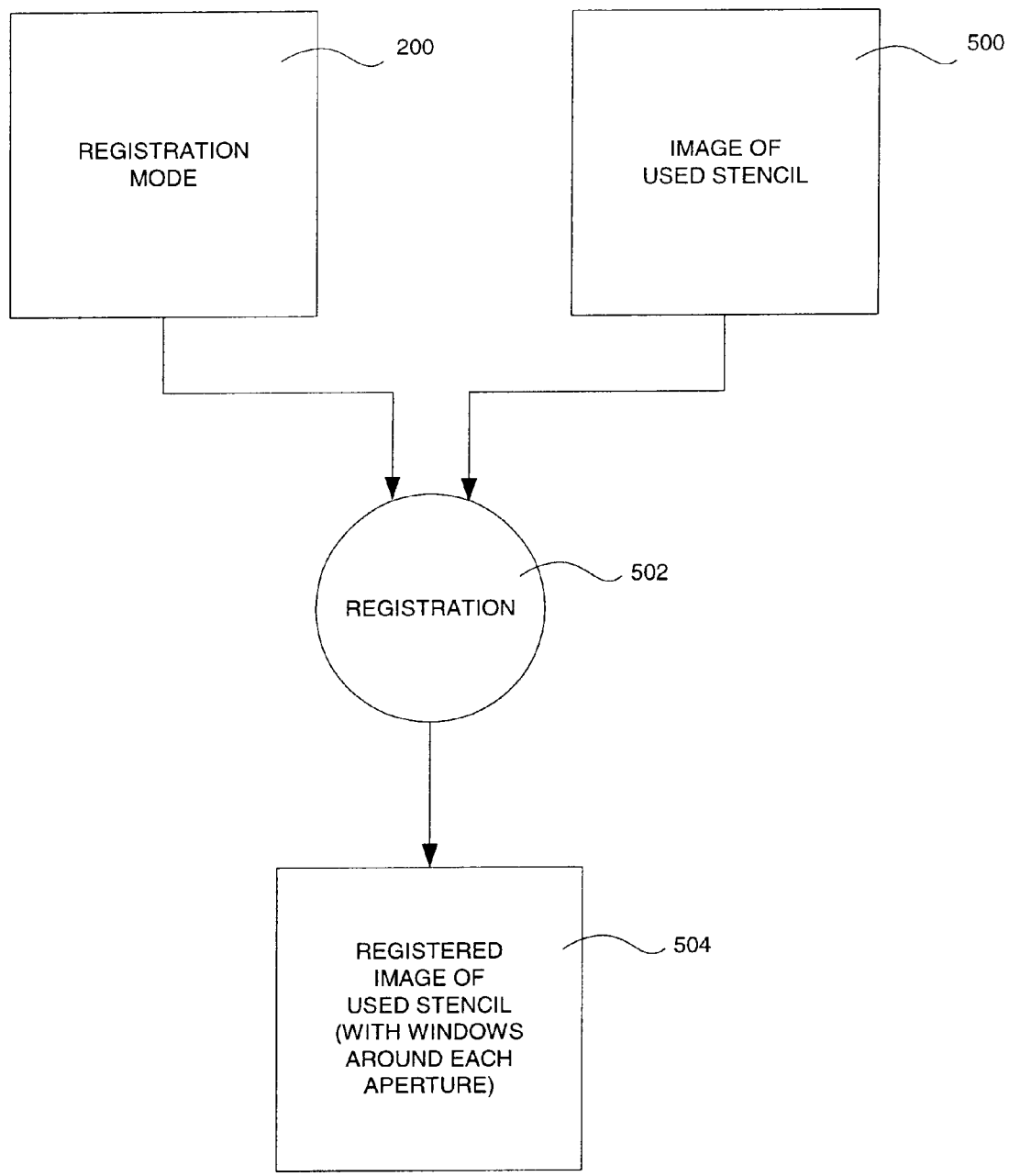
FIG. 9 is a flow diagram of a runtime registration step according to this invention.

In FIG. 9, the registration model 200 is combined with an acquired image of the used stencil 500. This image is taken at predetermined intervals during actual use of the stencil for application of solder. The registration step 502, as described above, is used to create a registered image of the used stencil 504. This registered image defines windows around each aperture. The lighting model 280 is then applied in FIG. 10 with the registered image of the used stencil 504 in a recalibration step 510. As noted above, recalibration is desirable since lighting conditions may vary continuously during runtime. Such runtime lighting variation can be caused by local variation in illuminator LEDs or bulbs and process room lighting changes. The recalibration step 510 is described below. It basically computes any overall lighting shift in the location of the aperture peak and adjusts the lighting model appropriately. The runtime image of the stencil is processed to form a class image in exactly the same way that the original lighting calibration image was processed to form a class image, except that the recalibrated lighting model is used to determine the mapping of runtime grayscale values to grayscale classes.

Figure 11:
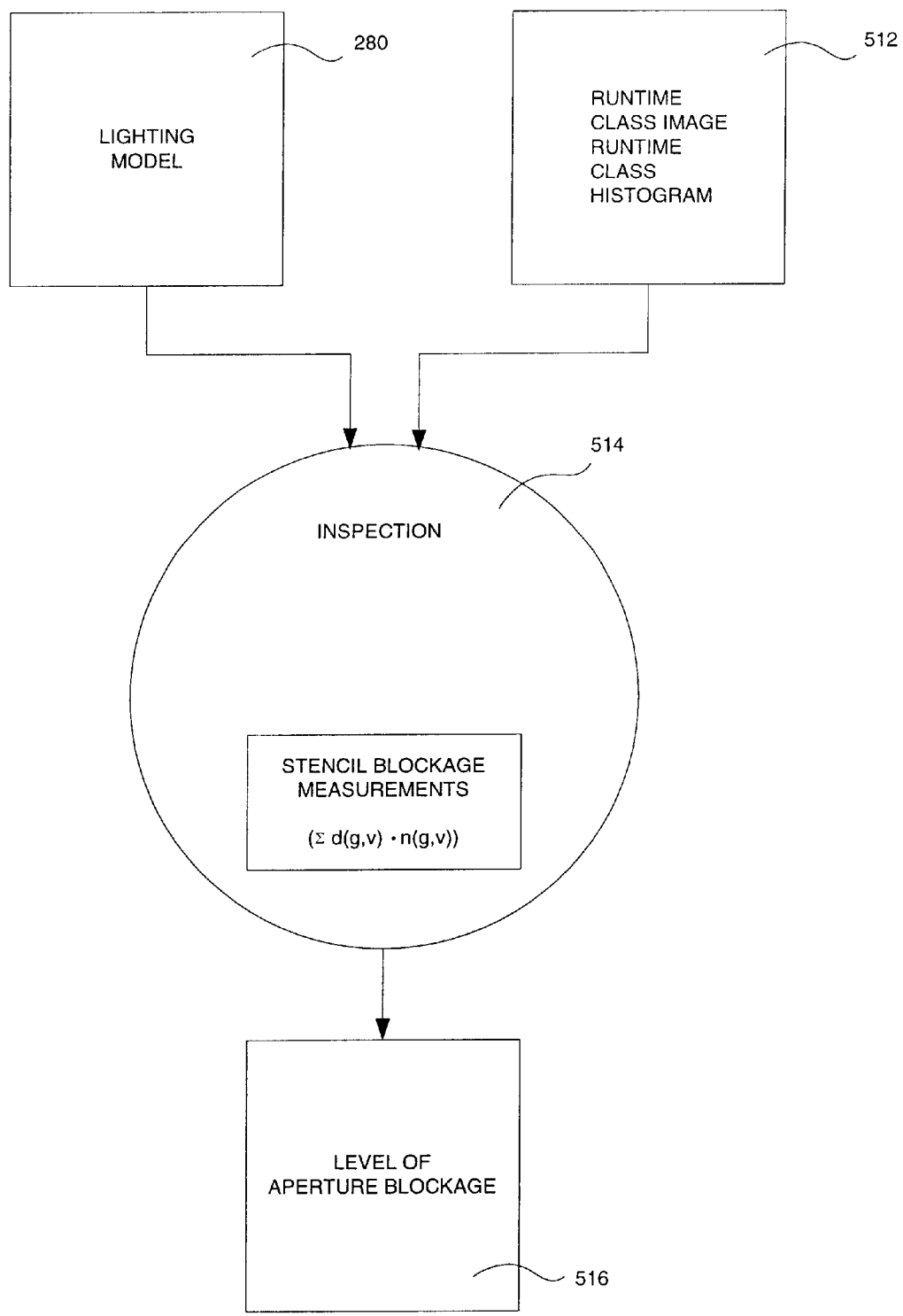
FIG. 11 is a flow diagram of a runtime inspection step, in which stencil blockage is finally determined, according to this invention.

FIG. 11 details the actual inspection of the used stencil during runtime in a manner described more generally above. The runtime class image is processed to form a runtime class histogram (step 512). Using the decision function created during lighting calibration (step 280) (including fraction clamps), a weight between zero and one, inclusive, is assigned to each class histogram bin. As in the lighting calibration step, the unblocked aperture area is computed as the sum over all the bins of the weight of the bin d(g,v) multiplied by the population n(g,v) of the bin. This occurs in step 514. The level of aperture blockage is then determined in step 516 as described above. In other words, the weighted area of the used stencil is divided by the weighted area of the clean stencil and that amount is subtracted from one (1). As noted above, blockage beyond a predetermined level is typically used as a basis for stopping the process and sounding an alarm, causing the stencil to be cleaned before proceeding.

Figure 10:
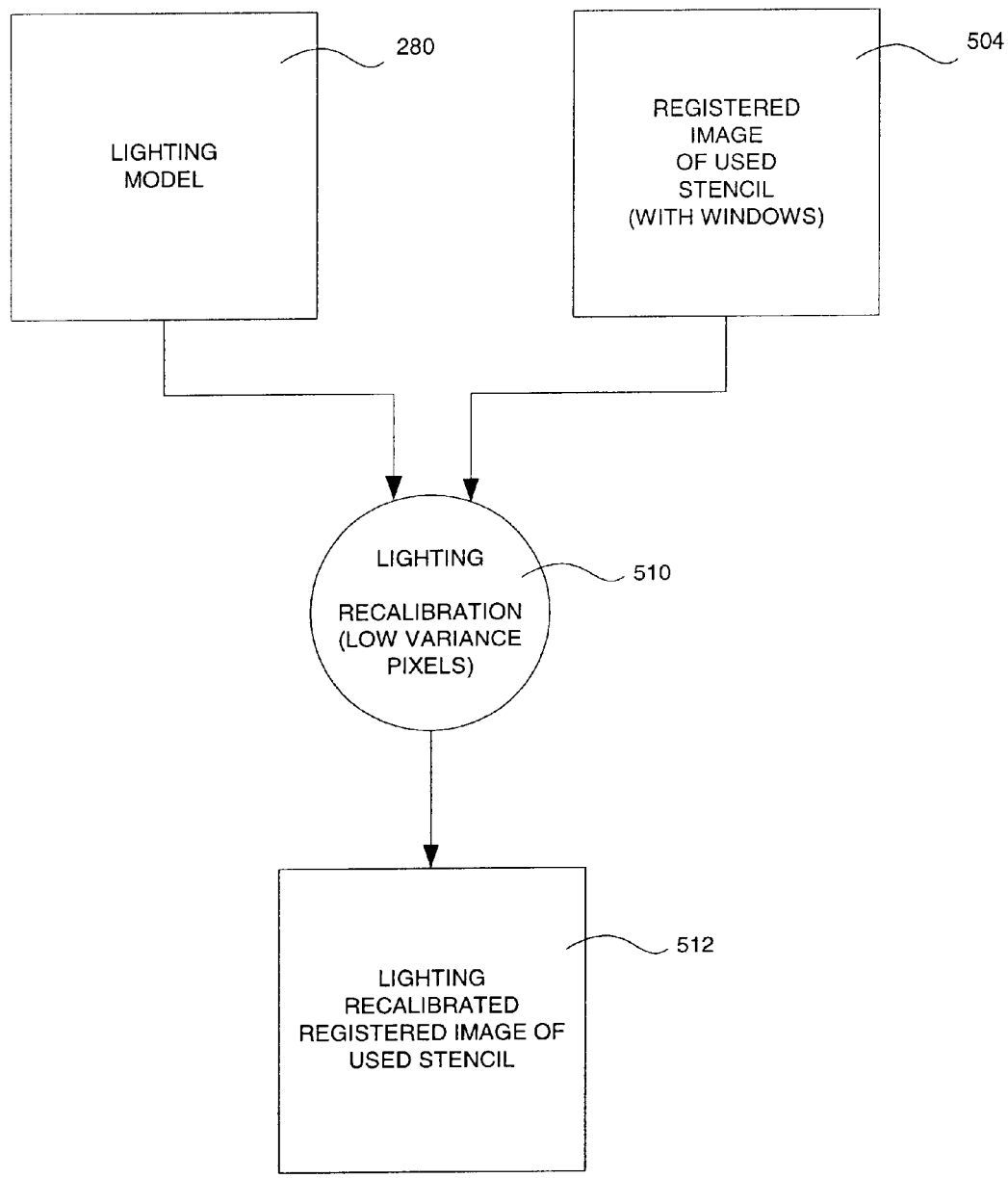
FIG. 10 is a flow diagram of a runtime lighting recalibration step according to this invention.

Note that the recalibration step 510 of FIG. 10 is used to compensate for a possible overall shift in lighting level, such as might result if the light source is not entirely stable or if there are significant changes in ambient light. The recalibration step can be omitted if lighting is sufficiently controlled. The basic method used in the preferred embodiment is relatively straightforward. The lighting shift is computed as the difference in grayscale aperture peak location of the desmeared runtime histogram relative to the grayscale aperture peak location of the desmeared lighting calibration histogram. Clearly, care must be taken to make sure that one is in fact using the aperture peak in the runtime image. For example, if the aperture is completely blocked, then there will be no measured aperture peak, and no recalibration should be reported. To reduce the chance of confusion between aperture and paste during recalibration, only pixels that are low in variance have their grayscale values used in computing the grayscale histogram used for recalibration. If a reliable aperture peak can be found in the runtime grayscale histogram, it can be used to recalibrate the model computed during lighting calibration. Alternate embodiments for recalibration are contemplated, especially if more information (e.g. on the actual light level) is available.

In summary, the above described process used as a combination of grayscale value and variance data to concentrate area measurements on portions of an image that are believed to be reliable indications of aperture. Other portions of the image are discarded based upon variance and/or grayscale value by assigning these discardable values into classes. Calibration and other functions are carried out based upon similar weightings so that an accurate measurement of aperture before process and during process can be obtained regardless of lighting conditions and the general reflectivity of solder paste deposited on the stencil. While some minor inaccuracies may be experienced, the above-described method provides a fairly robust procedure that can be relied upon in a number of different real-world processing environments.

The foregoing has been a detailed description of a preferred embodiment of the invention. Various modifications and additions can be made without departing from the spirit and scope. For example, measurement of aperture area is used to determine blockage. The techniques herein can be applied to other portions of a stencil, such as the non-aperture or stencil area which is also relatively uniform in appearance. In addition, the techniques herein can be applied to other surfaces such as circuit boards to which solder has been applied. For example, the area surrounding a solder pad can be analyzed to de is termine if the pad covers an appropriate portion of the area. While bins are clamped to a set fraction of the base area herein it is contemplated that this step can be omitted. In addition, recalibration can be omitted where uniform light is available. Conversely, the initial calibration step can be omitted and recalibration of lighting during runtime can be carried out exclusively in an alternate embodiment. It is further contemplated that registration can be omitted in certain embodiments, such as where one aperture is used, and an overall measurement of area of the clean stencil versus the used stencil can be employed to determine blockage. Also, while an eight-bit grayscale is detailed, the exact division of the grayscale can be varied to suit the particular imaging system and/or processor. The analysis described herein can be adapted readily to a different number of grayscale levels. Finally, the method described above allows the system to operate effectively with a minimum of operator input over a wide variety of lighting levels and for many types of solder paste; clearly, if additional information is available, it may be used to optimize, augment, or even replace some steps. Accordingly, this description it meant to be taken only by way of example and not to otherwise limit the scope of the invention.

What is claimed is:

1. A method for determining blockage of an aperture in a surface by a material comprising:
   (a) providing a predetermined level and orientation of illumination to the surface having the aperture;
   (b) acquiring a pre image of the surface prior to application of material thereonto; (c) extracting pre-application image characteristics from the pre image, image characteristics including, (i) grayscale intensity values for each of a plurality of pixels and (ii) intensity variance values for each of the pixels based upon respective nearby pixels as a measure of surface texture, to form a histogram of the pre image.
   (d) applying material onto the surface;
   (e) acquiring a post image of the surface, after the act of applying;
   (f) extracting post-application image characteristics from the post image, image characteristics including, (i) grayscale intensity values for each of a plurality of pixels and (ii) intensity variance values for each of the pixels based upon respective nearby pixels as a measure of surface texture, both characteristics based upon a model established from the pre-application image characteristics; and
   (g) ascertaining blockage of the aperture by differentiating the grayscale intensity values for pixels representing the aperture from gray scale intensity values for pixels representing the material, the step of ascertaining including the steps of
      i) establishing an image intensity histogram including a first plurality of histogram bins each containing grayscale intensity values for each of pixels of the pre image and pixels of the post image, each of the pixels being placed within respective predetermined intensity value ranges and wherein the histogram includes a second plurality of histogram bins for each of the first plurality of histogram bins, each second bin containing pixel intensity variance values falling within a respective predetermined intensity variance ranges for each of the pixel intensity values,
      (ii) shifting histogram bins to a different value in response to measured bin values of other apertures so as to place each of the histogram bins at a similar location to thereby compensate for image characteristic differences between apertures in an overall surface.

2. The method as set forth in claim 1 further comprising weighting the grayscale intensity values, based upon the act of differentiating, into a plurality of classes having respective weight values including zero, one and at least one value between zero and one.

3. The method as set forth in claim 2 wherein the ascertaining act (g) further comprises summing the classes and thereby deriving a first weight value for the pre image and a second weight value for the post image and calculating the difference between the first weight value and the second weight value.

4. The method as set forth in claim 1 wherein the ascertaining act (g) further comprises modelling the pixel data representative of the aperture as a single peak in the histogram having at least one of the histogram bins therein.

5. A method for determining blockage of an aperture in a surface by a material comprising:
   (a) providing a predetermined level and orientation of illumination to the surface having the aperture;
   (b) acquiring a pre image of the surface prior to application of material thereonto;
   (c) extracting pre-application image characteristics from the pre image, image characteristics including, (i) grayscale intensity values for each of a plurality of pixels and (ii) intensity variance values for each of the pixels based upon respective nearby pixels as a measure of surface texture.
   (d) applying material onto the surface;
   (e) acquiring a post image of the surface, after the act of applying;
   (f) extracting post-application image characteristics from the post image, image characteristics including, (i) grayscale intensity values for each of a plurality of pixels and (ii) intensity variance values for each of the pixels based upon respective nearby pixels as a measure of surface texture, both characteristics based upon a model established from the pre-application image characteristics; and
   (g) ascertaining blockage of the aperture by differentiating the grayscale intensity values for pixels representing the aperture from grayscale intensity values for pixels representing the material by grouping them into a plurality of classes having respective weight values including zero, one, and at least one value between zero and one, and summing the classes to derive a first weight value for the viewed image prior to the applying act (c) and a second weight value after the applying act (d) and calculating the difference between the first weight value and the second weight value.

6. The method as set forth in claim 5 wherein the ascertaining act (g) further comprises differentiating the grayscale intensity values for pixels representing the aperture from grayscale intensity values for pixels representing the material based upon the intensity variance values, including differentiating pixels with high intensity variance values from pixels with low intensity variance values.

7. The method as set forth in claim 5 wherein the ascertaining act (g) further comprises differentiating the grayscale intensity values for pixels representing the aperture from grayscale intensity values for pixels representing the material based upon intensity variance values including differentiating between intensity variance values based upon categorizations determined using the pre-application image characteristics.

8. The method as set forth in claim 5 wherein the ascertaining act (g) includes differentiating the grayscale intensity values for pixels representing the aperture from grayscale intensity values for pixels representing the material based upon both grayscale intensity values and intensity variance values in a simultaneous differentiation.

9. The method as set forth in claim 6 further comprising weighting the grayscale intensity values, based upon the act of differentiating, into a plurality of threshold classes having respective weight values including zero, one and at least one value between zero and one.

10. The method as set forth in claim 6 further wherein the class histogram includes a first plurality of histogram bins each containing grayscale intensity values for each of pixels of the pre image and pixels of the post application image, each of the pixels being placed within respective predetermined intensity value ranges and wherein the class histogram includes a second plurality of histogram bins for each of the first plurality of histogram bins, each second bin containing pixel intensity variance values falling within a respective predetermined intensity variance ranges for each of the pixel intensity values.

11. The method as set forth in claim 5 further comprising, registering the pre-application image characteristics and the post-application image characteristics with respect to a model image data pattern defining an approximate shape and location of the aperture on the surface when it is free of material applied thereonto.

12. The method as set forth in claim 5 wherein the ascertaining act (g) further comprises, establishing an image intensity histogram including a first plurality of histogram bins each containing grayscale intensity values for each of pixels of the pre image and pixels of the post image, each of the pixels being placed within respective predetermined intensity value ranges and wherein the histogram includes a second plurality of histogram bins for each of the first plurality of histogram bins, each second bin containing pixel intensity variance values falling within a respective predetermined intensity variance ranges for each of the pixel intensity values.

13. The method as set forth in claim 12 wherein the ascertaining act (g) further comprises, shifting histogram bins to a different value in response to measured bin values of other apertures so as to place each of the histogram bins at a similar location to thereby compensate for image characteristic differences between apertures in an overall surface.

14. The method as set forth in claim 12 wherein the ascertaining act (g) further comprises modelling the pixel data representative of the aperture as a single peak in the histogram, the peak having at least one of the histogram bins therein.

15. The method as set forth in claim 12 wherein the pixels representing the aperture and the pixels representing the material are grouped into the plurality of classes based upon the first and second plurality of histogram bins.

* * * * *